United States Patent
Liu et al.

(10) Patent No.: US 11,895,921 B2
(45) Date of Patent: Feb. 6, 2024

(54) MANUFACTURING PROCESS FOR PIEZOELECTRIC FIBER HAVING SWISS-ROLL STRUCTURE

(71) Applicants: NANTONG TEXTILE & SILK IND TECH RES INST, Jiangsu (CN); SOOCHOW UNIVERSITY, Jiangsu (CN)

(72) Inventors: Yuqing Liu, Jiangsu (CN); Yuting Wang, Jiangsu (CN); Jing Hu, Jiangsu (CN); Xin Yang, Jiangsu (CN); Ranran Li, Jiangsu (CN); Jian Fang, Jiangsu (CN)

(73) Assignees: NANTONG TEXTILE & SILK IND TECH RES INST, Jiangsu (CN); SOOCHOW UNIVERSITY, Jiangsu (CN)

( * ) Notice: Subject to any disclaimer, the term of this patent is extended or adjusted under 35 U.S.C. 154(b) by 0 days.

(21) Appl. No.: 18/013,683
(22) PCT Filed: Jun. 25, 2021
(86) PCT No.: PCT/CN2021/102412
§ 371 (c)(1),
(2) Date: Dec. 29, 2022
(87) PCT Pub. No.: WO2022/041995
PCT Pub. Date: Mar. 3, 2022

(65) Prior Publication Data
US 2023/0232719 A1     Jul. 20, 2023

(30) Foreign Application Priority Data
Aug. 26, 2020 (CN) .......................... 202010869980.4

(51) Int. Cl.
*H10N 30/08*     (2023.01)
*H10N 30/50*     (2023.01)
(Continued)

(52) U.S. Cl.
CPC ........... *H10N 30/08* (2023.02); *H10N 30/057* (2023.02); *H10N 30/506* (2023.02); *H10N 30/877* (2023.02); *Y10T 29/42* (2015.01)

(58) Field of Classification Search
CPC .... H10N 30/057; H10N 30/08; H10N 30/506; H10N 30/877; Y10T 29/42
See application file for complete search history.

(56) References Cited

U.S. PATENT DOCUMENTS

| 4,688,306 A | * | 8/1987 | Soni | ..................... Y10T 29/42 29/25.35 |
| 5,559,387 A | | 9/1996 | Beurrier | |

(Continued)

FOREIGN PATENT DOCUMENTS

| CN | 101358388 B | 8/2010 |
| CN | 103258952 A | 8/2013 |

(Continued)

OTHER PUBLICATIONS

Luong et al., "Performance of a Piezo-composite generating element," 2011 8th International Conference on Ubiquitous Robots and Ambient Intelligence (URAI), Incheon, Korea (South), 2011, pp. 203-204. (Year: 2011).*

(Continued)

*Primary Examiner* — A. Dexter Tugbang
(74) *Attorney, Agent, or Firm* — Schmeiser, Olsen & Watts, LLP

(57) ABSTRACT

A preparation method for a piezoelectric fiber is provided including a piezoelectric functional layer and an insulating layer coated on the piezoelectric functional layer. The piezoelectric functional layer includes a piezoelectric composite layer of a spiral winding structure, and the piezoelectric composite layer includes a first piezoelectric layer, a conductive layer and a second piezoelectric layer that are sequentially stacked. The preparation method includes taking one end of the piezoelectric composite layer as a winding axis, winding the piezoelectric composite layer in a direction perpendicular to the winding axis to form the piezoelectric functional layer, wherein turns of winding the piezoelectric composite layer are greater than 5, coating the piezoelectric (Continued)

functional layer with the insulating layer, and vacuum heating to consolidate, to prepare a preform rod.

10 Claims, 1 Drawing Sheet

(51) Int. Cl.
 *H10N 30/057* (2023.01)
 *H10N 30/87* (2023.01)

(56) References Cited

U.S. PATENT DOCUMENTS

| | | | |
|---|---|---|---|
| 6,278,222 B1 | 8/2001 | Katsuragi | |
| 2009/0220765 A1* | 9/2009 | Okamura | Y10T 29/42 29/25.35 |
| 2017/0331027 A1 | 11/2017 | Kim et al. | |

FOREIGN PATENT DOCUMENTS

| | | |
|---|---|---|
| CN | 106683766 A | 5/2017 |
| CN | 107000403 A | 8/2017 |
| CN | 109457310 A | 3/2019 |
| CN | 112038480 A | 12/2020 |
| DE | 102008042863 A1 | 4/2010 |
| JP | H11112046 A | 4/1999 |
| JP | 2014212552 A * | 11/2014 |
| JP | S5542474 A | 12/2017 |
| KR | 20190107915 A | 9/2019 |

OTHER PUBLICATIONS

Machine Translation of Japanese Patent Publication, JPH 11-112046. (Year: 2023).*
International Search Report for PCT/CN2021/102412, dated Sep. 28, 2021.
Written Opinion for PCT/CN2021/102412, dated Sep. 28, 2021.

* cited by examiner

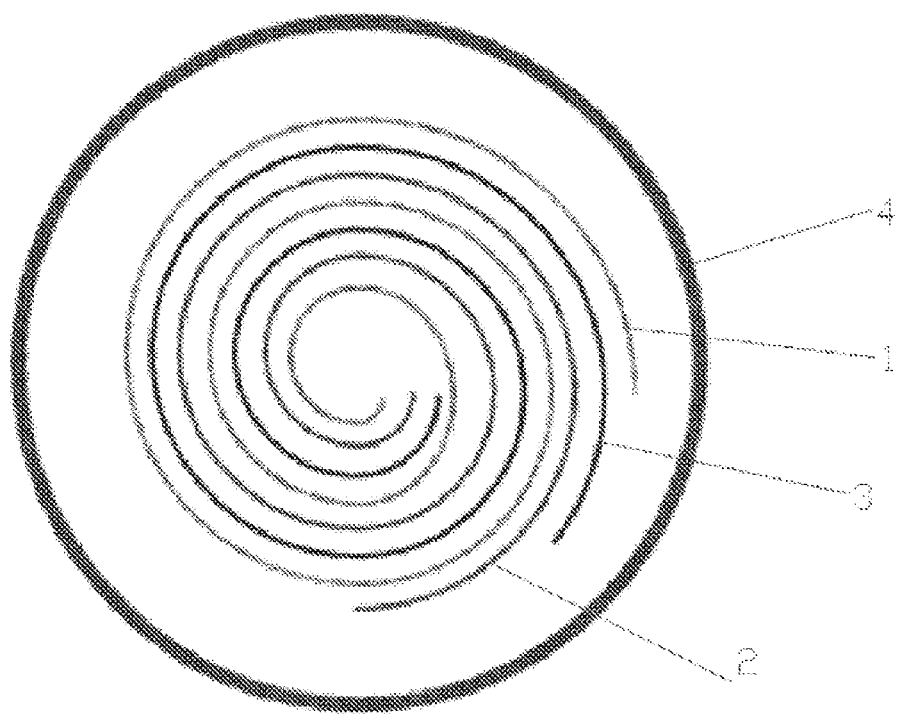

MANUFACTURING PROCESS FOR PIEZOELECTRIC FIBER HAVING SWISS-ROLL STRUCTURE

CROSS-REFERENCE TO RELATED APPLICATIONS

This application claims priority to PCT Application No. PCT/CN2021/102412, having a filing date of Jun. 25, 2021, which claims priority to CN Application No. 202010869980.4, having a filing date of Aug. 26, 2020, the entire contents both of which are hereby incorporated by reference.

FIELD OF TECHNOLOGY

The following belongs to the field of functional fiber, in particular, relates to a piezoelectric fiber having a Swiss-roll structure, and a preparation method therefor and use thereof.

BACKGROUND

Piezoelectric fiber has great potential applications in sensors, actuators, ultrasonic sensor devices, automobiles, aviation, and other fields as it has excellent properties such as high piezoelectric strain constant and thickness electromechanical coupling coefficient, low mechanical quality factor and acoustic impedance.

The existing methods for manufacturing piezoelectric fiber mainly include: growing piezoceramic material-wire/microfiber directly on ZnO nanorods or ZnO nanowires (NWs), $BaTiO_3$(BTO) nanostructures or $Pb(Zr_{0.52}Ti_{0.48})O_3$ (PZT) nanowires, or wet-extruding piezoceramic material-wire/microfiber. For example, piezoelectric fibers are prepared by depositing ZnO nanorods on copper wires; Pb(Nb, Ni)$O_3$—Pb(Zr,Ti)$O_3$ (PNN-PZT) piezoelectric ceramic fibers are prepared by extruding a mixture of PNN-PZT powder and organic solvent with a 50 μm Pt fibre core.

Another example is Chinese patent CN101358388B, which discloses a preparation method of PZT piezoelectric fiber, and the specific steps are as follows:

(1) PZT sol preparation: dissolving lead acetate, zirconium nitrate, and tetrabutyl titanate with a mass ratio of 110:56:44 in an organic solvent by ultrasonic waves, adding an appropriate amount of stabilizer, mixing a precursor solution of the three, and under conditions of low temperature heating at 80° C. and ultrasonic vibration, adding water and acetic acid in a volume ratio of 1:0.5 to 1:3 to adjust the degree of hydrolysis of the solution, adjusting the concentration of the sol to be 0.3 mol/L, and mixing the mixture well under magnetic stirring to give the sol;

(2) Preparation of sol-powder mixed system: mixing the sol and PZT powder in a mass ratio of 1:1 to 1:9, and under conditions of low temperature heating at 80° C. and uniformly stirring, grinding for a few minutes by a mortar, or rolling with a film rolling machine, so that the mixture is mixed well and has suitable plasticity;

(3) Preparation of PZT piezoelectric fiber: placing the plastic mixture obtained in the above step (2) in a suitable preheating mold, preparing a cellulose blank on an extruder under conditions of a certain pressure and low temperature heating at 60° C., and placing the cellulose blank on a flat glass and drying at room temperature to remove the adsorbed water on the fiber surface;

(4) Heat treatment of PZT piezoelectric fiber: drying the fiber at room temperature in a low-temperature drying oven, and then heat treating to obtain a PZT piezoelectric fiber.

However, the above-mentioned existing technologies still have shortcomings: the preparation process is complicated; the fabricated piezoelectric fibers have poor mechanical reliability, and the fiber structure may be damaged by frequent and violent mechanical movements, for example, continuous bending will cause the piezoelectric layer to crack, even peel off from the fiber core, and the piezoelectric effect is not significant, which makes it unsuitable for true wearable applications.

Therefore, it is of great practical significance to prepare piezoelectric fibers with good piezoelectric effect, good mechanical properties, good durability, and suitable for wearable applications.

SUMMARY

An aspect relates to a new piezoelectric fiber, which has a Swiss-roll structure, and has a good mechanical performance, good durability, and a better piezoelectric effect, and especially, the unique structure thereof enables the piezoelectric fiber to collect mechanical energy from different directions.

Meanwhile, the present disclosure further provides a preparation method for a piezoelectric fiber mentioned above.

Meanwhile, the present disclosure further provides use of the above piezoelectric fiber in sensors and drivers, which also has great potential applications in the fields of automobiles and aviation; wherein, the sensors include but are not limited to ultrasonic sensors and the like.

To solve the above technical problems, a technical solution employed by the present disclosure is as follows:

a piezoelectric fiber, comprising a piezoelectric functional layer and an insulating layer coated on the piezoelectric functional layer; wherein, the piezoelectric functional layer comprises a piezoelectric composite layer of a spiral winding structure, the piezoelectric composite layer is wound into more than five turns attached to one another from a center of the spiral winding structure to the outer side, and the piezoelectric composite layer comprises a first piezoelectric layer, a conductive layer and a second piezoelectric layer that are sequentially stacked.

Further, in the present disclosure, the piezoelectric composite layer of a spiral winding structure is in the form similar to a "Swiss-roll" structure, that is, the piezoelectric fiber of the present disclosure comprises a piezoelectric functional layer and an insulating layer coated on the piezoelectric functional layer, the piezoelectric functional layer may be composed of a piezoelectric composite layer of a "Swiss-roll" structure, in particular, the piezoelectric composite layer are wound into the "Swiss-roll" structure to obtain the piezoelectric functional layer; wherein the piezoelectric composite layer comprises a first piezoelectric layer, a conductive layer and a second piezoelectric layer that are sequentially stacked. In one implementation of the present disclosure, the piezoelectric composite layer is composed of the first piezoelectric layer, the conductive layer and the second piezoelectric layer that are sequentially stacked.

According to embodiments of the invention, a thickness of the first piezoelectric layer, a thickness of the conductive layer, and a thickness of the second piezoelectric layer are independently 100-300 μm.

According to embodiments of the invention, the thickness of the first piezoelectric layer, the thickness of the conductive layer, and the thickness of the second piezoelectric layer are the same.

According to some preferred aspects of the present disclosure, the first piezoelectric layer and the second piezoelectric layer are independently selected from the group consisting of polyvinylidene fluoride (PVDF), poly(vinylidene fluoride-trifluoroethylene) (P(VDF-TrFE)), perovskite ceramic (BTO or PZT) nanoparticle-impregnated polyvinylidene fluoride and carbon nanotube (CNT)-impregnated polyvinylidene fluoride, and combinations thereof.

According to some preferred aspects of the present disclosure, the piezoelectric composite layer is obtained by stacking the first piezoelectric layer, the conductive layer and the second piezoelectric layer in sequence, and then softening the first piezoelectric layer and the second piezoelectric layer in a heated state, respectively. According to a specific aspect of the present disclosure, the temperature of the heated state is 85-105° C. In the present disclosure, in the preparation process of the piezoelectric composite layer, the purpose of heating is to soften the first piezoelectric layer and the second piezoelectric layer and then attach to the surface of the conductive layer better, so as to achieve a tight combination between the three, which can avoid the separation phenomenon in the later winding process, and ensure better piezoelectric effect and mechanical properties and the like.

According to embodiments of the invention, material of the conductive layer is selected from the group consisting of carbon-supported polyethylene (CPE), carbon-impregnated low-density polyethylene (C-LDPE), graphene, and combinations thereof.

According to embodiments of the invention, material of the insulating layer is selected from the group consisting of polycarbonate (PC), polydimethylsiloxane (PDMS), polyethylene terephthalate (PET), and combinations thereof.

According to some preferred aspects of the present disclosure, the piezoelectric fiber is prepared by the following method: coating the piezoelectric functional layer with the insulating layer, and carrying out vacuum heating consolidation to prepare a preform rod, and then thermal stretching the preform rod to complete preparation.

According to some specific aspects of the present disclosure, a thickness of the insulating layer is 500-700 μm. According to a specific aspect of the present disclosure, the thickness of the insulating layer is about 600 μm.

The present disclosure provides another technical solution: a preparation method for the above piezoelectric fiber, comprising the following steps:

(1) stacking the first piezoelectric layer, the conductive layer and the second piezoelectric layer in sequence, and then respectively softening the first piezoelectric layer and the second piezoelectric layer in a heated state to prepare the piezoelectric composite layer;

(2) winding the piezoelectric composite layer according to the Swiss-roll structure in a direction perpendicular to its own axis to form the piezoelectric functional layer, coating the piezoelectric functional layer with the insulating layer, and vacuum heating to consolidate, to prepare a preform rod;

(3) thermal stretching on the preform rod to prepare the piezoelectric fiber.

According to some preferred aspects of the present disclosure, in step (1), temperature of the heated state is 85-105° C.

According to some preferred aspects of the present disclosure, in step (2), during the process of preparing the piezoelectric functional layer, turns of wingding the piezoelectric composite layer are greater than 5.

According to some preferred aspects of the present disclosure, in step (2), the temperature of the vacuum heating is 110-120° C. According to the present disclosure, the vacuum heating is beneficial to remove residual gas and form a high-quality interface, ensuring better piezoelectric effect and mechanical properties.

According to some specific aspects of the present disclosure, the diameter of the preform rod is 10-100 mm, or may be 10-50 mm, or may be 20-40 mm.

According to some preferred aspects of the present disclosure, in step (3), the thermal stretching is carried out in a heating and stretching furnace with three temperature zones, and the heating temperatures in the three temperature zones are as follows: 135-145° C., 210-230° C., and 110-130° C.

The present disclosure further provides another technical solution: use of the above piezoelectric fiber in sensors and drivers, wherein, the sensors include but are not limited to ultrasonic sensors and the like.

Due to the use of the above technical solutions, the present disclosure has the following advantages over the conventional art:

the present disclosure innovatively prepares the piezoelectric fibers in the form of a Swiss-roll structure, which not only greatly increases the effective surface area and reduces the layer thickness, so that the voltage and current are greatly increased, and such fibers can generate more electric energy; while its flexibility and uniformity are also better than existing layered or core-shell structured piezoelectric fibers, which provides opportunities for novel functional properties of devices (such as wearable devices), while this unique structure enables it to collect mechanical energy from different directions and obtain better piezoelectric effect, thus enabling more complex functions and realizing a truly multifunctional fiber.

BRIEF DESCRIPTION

Some of the embodiments will be described in detail, with references to the following FIGURES, wherein like designations denote like members, wherein:

FIG. 1 is a schematic cross-sectional structure diagram of a piezoelectric fiber according to Embodiment 1 of the present disclosure.

REFERENCE NUMBERS

1—first piezoelectric layer; 2—conductive layer; 3—second piezoelectric layer; 4—insulating layer.

DETAILED DESCRIPTION

In the following, the specific embodiments are combined to further explain the solutions mentioned above. It should be understood that, those embodiments are to explain the basic principle, major features and advantages of the present disclosure, and the present disclosure is not limited by the scope of the following embodiments; the implementation conditions employed by the embodiments may be further adjusted according to particular requirements, and undefined implementation conditions usually are conditions in conventional experiments.

In the following, unless otherwise specified, all raw materials are basically commercially available or prepared by conventional methods in the field. In the following embodiments, polyvinylidene fluoride (PVDF) was purchased from Dongyue Shenzhou, model DS206; carbon powder was purchased from Dongkai, model 1000-98; low-density polyethylene (LDPE) was purchased from Yanshan Petrochemical, model 1I50A; polydimethylsiloxane (PDMS) was purchased from Zhongao, model ZA-201; perovskite ceramic (BTO) nanoparticles were purchased from Nanjing Hongde Nano, model HDLZ01.

Carbon-impregnated low-density polyethylene (C-LDPE) was prepared into a membrane with the help of a mold by dispersing carbon in low-density polyethylene through processes of ultrasonic or stirring, and so on; polyvinylidene fluoride can be processed into a membrane by extrusion; perovskite ceramic (BTO) nanoparticles were ultrasonically dispersed to prepare a suspension, and PVDF was swollen in acetone (purchased from Yinchuan, model yc-10) for 10 minutes with a magnetic stirrer. Then, the two suspensions were mixed together with a magnetic exciter, heated at 100° C. for 1 h, and formed into a perovskite ceramic (BTO) nanoparticles-impregnated PVDF membrane by electrospinning.

Embodiment 1

This embodiment provides a piezoelectric fiber, a schematic diagram of the cross section thereof is as shown in FIG. 1, the piezoelectric fiber comprises a piezoelectric functional layer and an insulating layer 4 coated on the piezoelectric functional layer, the piezoelectric functional layer is formed into a spiral winding structure by winding a piezoelectric composite layer according to a Swiss-roll structure, that is, taking one end of the piezoelectric composite layer as the winding axis, winding the piezoelectric composite layer in the direction perpendicular to its own axis to form a spiral and plate-like structure, the piezoelectric composite layer comprises a first piezoelectric layer 1, a conductive layer 2 and a second piezoelectric layer 3 that are sequentially stacked.

Wherein, the first piezoelectric layer 1 and the second piezoelectric layer 3 are respectively made of polyvinylidene fluoride (PVDF), the conductive layer 2 is made of carbon-impregnated low-density polyethylene (C-LDPE), the thickness of the first piezoelectric layer 1, the conductive layer 2 and the second piezoelectric layer 3 is 300 nm; the insulating layer 4 is made of polydimethylsiloxane (PDMS) with a thickness of 6000 nm.

The preparation method for the piezoelectric fiber of this embodiment was: the first piezoelectric layer 1, the conductive layer 2 and the second piezoelectric layer 3 were stacked in sequence, heated to 100° C. to soften the first piezoelectric layer 1 and the second piezoelectric layer 3 slightly and attach them to the conductive layer 2 to prepare the piezoelectric composite layer, by taking its one end as the winding axis, the piezoelectric composite layer was wound into a Swiss-roll structure with 30 turns in the direction perpendicular to its winding axis, excess material was cut off, and the piezoelectric functional layer was prepared, which was sealed with the insulating layer 4 made of polydimethylsiloxane (PDMS), then consolidation was carried out at 115° C. for 20 min in a vacuum furnace to prepare a preform rod.

The prepared preform rod was placed into a heating and stretching furnace with three temperature zones to carry out thermal stretching, then wound into a reel (for example, winding many turns on a shaft for easy storage, use, etc.) to obtain a piezoelectric fiber with a Swiss-roll structure. Wherein, the feeding speed was 2 mm/min, the heating temperatures in the three temperature zones were 140° C., 220° C. and 120° C., respectively, the winding speed was 1800 mm/min, and the diameter of piezoelectric fiber was about 1 mm.

The obtained piezoelectric fiber was tested as follows:
(1) the prepared piezoelectric fiber was polarized at a voltage of 5 kV in a silicone oil bath at 80° C. for 24 h;
(2) the piezoelectric fiber was fixed on a polyimide (PI) substrate with a length of 10 cm, a width of 5 cm, and a thickness of 1 mm to prepare a piezoelectric generator. One end of the PI substrate was fixed and the other end was moved horizontally by a micro-positioning table, thereby bending the piezoelectric generator to generate voltage and current;
(3) when the moving end of the generator was offset to 10 mm, the piezoelectric generator was bent, the corresponding open-circuit voltage was increased to 3 V, and the short-circuit current was 18 nA;
(4) the piezoelectric generator was continuously subjected to a 3-day bending release test (GB/T 1449-2005, the same as the following) to evaluate its mechanical stability, and the amplitudes of the measured output voltage and current showed high stability over 25920 bending release cycles.

Embodiment 2

This embodiment provides a piezoelectric fiber, the piezoelectric fiber comprises a piezoelectric functional layer and an insulating layer coated on the piezoelectric functional layer, the piezoelectric functional layer is formed into a spiral winding structure by winding a piezoelectric composite layer according to a Swiss-roll structure, that is, taking one end of the piezoelectric composite layer as the winding axis, winding the piezoelectric composite layer in the direction perpendicular to its own axis to form a spiral and plate-like structure, the piezoelectric composite layer comprises a first piezoelectric layer, a conductive layer and a second piezoelectric layer that are sequentially stacked.

Wherein, the first piezoelectric layer and the second piezoelectric layer are respectively made of polyvinylidene fluoride (PVDF), the conductive layer is made of carbon-impregnated low-density polyethylene (C-LDPE), the thickness of the first piezoelectric layer, the conductive layer and the second piezoelectric layer is 150 μm; the insulating layer is made of polydimethylsiloxane (PDMS) with a thickness of 6000 pm.

The preparation method for the piezoelectric fiber of this embodiment was: the first piezoelectric layer, the conductive layer and the second piezoelectric layer were stacked in sequence, heated to 100° C. to soften the first piezoelectric layer and the second piezoelectric layer slightly and attach them to the conductive layer to prepare the piezoelectric composite layer, by taking its one end as the winding axis, the piezoelectric composite layer was wound into a Swiss-roll structure with 60 turns in the direction perpendicular to its winding axis, excess material was cut off, and the piezoelectric functional layer was prepared, which is sealed with the insulating layer made of polydimethylsiloxane (PDMS), then consolidation was carried out at 115° C. for 20 min in a vacuum furnace to prepare a preform rod.

The prepared preform rod was placed into a heating and stretching furnace with three temperature zones to carry out thermal stretching, then wound into a reel to obtain a piezoelectric fiber with a Swiss-roll structure. Wherein, the feeding speed was 2 mm/min, the heating temperatures in the three temperature zones were 140° C., 220° C. and 120° C., respectively, the winding speed was 1800 mm/min, and the diameter of piezoelectric fiber was about 1 mm.

The obtained piezoelectric fiber was tested as follows:
(1) the prepared piezoelectric fiber was polarized at a voltage of 5 kV in a silicone oil bath at 80° C. for 24 h;
(2) the piezoelectric fiber was fixed on a polyimide (PI) substrate with a length of 10 cm, a width of 5 cm, and a thickness of 1 mm to prepare a piezoelectric generator. One end of the PI substrate was fixed and the other end was moved horizontally by a micro-positioning table, thereby bending the piezoelectric generator to generate voltage and current;
(3) when the moving end of the generator was offset to 10 mm, the piezoelectric generator was bent, the corresponding open-circuit voltage was increased to 6 V, and the short-circuit current was 36 nA;
(4) the piezoelectric generator was continuously subjected to a 3-day bending release test to evaluate its mechanical stability, and the amplitudes of the measured output voltage and current showed high stability over 25920 bending release cycles.

Embodiment 3

This embodiment provides a piezoelectric fiber, the piezoelectric fiber comprises a piezoelectric functional layer and an insulating layer coated on the piezoelectric functional layer, the piezoelectric functional layer is formed into a spiral winding structure by winding a piezoelectric composite layer according to a Swiss-roll structure, that is, taking one end of the piezoelectric composite layer as the winding axis, winding the piezoelectric composite layer in the direction perpendicular to its own axis to form a spiral and plate-like structure, the piezoelectric composite layer comprises a first piezoelectric layer, a conductive layer and a second piezoelectric layer that are sequentially stacked.

Wherein, the first piezoelectric layer and the second piezoelectric layer are respectively made of polyvinylidene fluoride (PVDF), the conductive layer is made of carbon-impregnated low-density polyethylene (C-LDPE), the thickness of the first piezoelectric layer, the conductive layer and the second piezoelectric layer is 100 μm; the insulating layer is made of polydimethylsiloxane (PDMS) with a thickness of 6000 μm.

The preparation method for the piezoelectric fiber of this embodiment was: the first piezoelectric layer, the conductive layer and the second piezoelectric layer were stacked in sequence, heated to 100° C. to soften the first piezoelectric layer and the second piezoelectric layer slightly and attach them to the conductive layer to prepare the piezoelectric composite layer, by taking its one end as the winding axis, the piezoelectric composite layer was wound into a Swiss-roll structure with 90 turns in the direction perpendicular to its winding axis, excess material was cut off, and the piezoelectric functional layer was prepared, which is sealed with the insulating layer made of polydimethylsiloxane (PDMS), then consolidation was carried out at 115° C. for 20 min in a vacuum furnace to prepare a preform rod.

The prepared preform rod was placed into a heating and stretching furnace with three temperature zones to carry out thermal stretching, then wound into a reel to obtain a piezoelectric fiber with a Swiss-roll structure. Wherein, the feeding speed was 2 mm/min, the heating temperatures in the three temperature zones were 140° C., 220° C. and 120° C., respectively, the winding speed was 1800 mm/min, and the diameter of piezoelectric fiber was about 1 mm.

The obtained piezoelectric fiber was tested as follows:
(1) the prepared piezoelectric fiber was polarized at a voltage of 5 kV in a silicone oil bath at 80° C. for 24 h;
(2) the piezoelectric fiber was fixed on a polyimide (PI) substrate with a length of 10 cm, a width of 5 cm, and a thickness of 1 mm to prepare a piezoelectric generator. One end of the PI substrate was fixed and the other end was moved horizontally by a micro-positioning table, thereby bending the piezoelectric generator to generate voltage and current;
(3) when the moving end of the generator was offset to 10 mm, the piezoelectric generator was bent, the corresponding open-circuit voltage was increased to 8 V, and the short-circuit current was 48 nA;
(4) the piezoelectric generator was continuously subjected to a 3-day bending release test to evaluate its mechanical stability, and the amplitudes of the measured output voltage and current showed high stability over 25920 bending release cycles.

Embodiment 4

This embodiment provides a piezoelectric fiber, the piezoelectric fiber comprises a piezoelectric functional layer and an insulating layer coated on the piezoelectric functional layer, the piezoelectric functional layer is formed into a spiral winding structure by winding a piezoelectric composite layer according to a Swiss-roll structure, that is, taking one end of the piezoelectric composite layer as the winding axis, winding the piezoelectric composite layer in the direction perpendicular to its own axis to form a spiral and plate-like structure, the piezoelectric composite layer comprises a first piezoelectric layer, a conductive layer and a second piezoelectric layer that are sequentially stacked;

Wherein, the first piezoelectric layer and the second piezoelectric layer are respectively made of perovskite ceramic (BTO) nanoparticles-impregnated PVDF, the conductive layer is made of carbon-impregnated low-density polyethylene (C-LDPE), the thickness of the first piezoelectric layer, the conductive layer and the second piezoelectric layer is 100 μm; the insulating layer is made of polydimethylsiloxane (PDMS) with a thickness of 6000 μm.

The preparation method for the piezoelectric fiber of this embodiment was: the first piezoelectric layer, the conductive layer and the second piezoelectric layer were stacked in sequence, heated to 100° C. to soften the first piezoelectric layer and the second piezoelectric layer slightly and attach them to the conductive layer to prepare the piezoelectric composite layer, by taking its one end as the winding axis, the piezoelectric composite layer was wound into a Swiss-roll structure with 90 turns in the direction perpendicular to its winding axis, excess material was cut off, and the piezoelectric functional layer was prepared, which is sealed with the insulating layer made of polydimethylsiloxane (PDMS), then consolidation was carried out at 115° C. for 20 min in a vacuum furnace to prepare a preform rod.

The prepared preform rod was placed into a heating and stretching furnace with three-temperature zones to carry out thermal stretching, then wound into a reel to obtain a piezoelectric fiber with a Swiss-roll structure. Wherein, the feeding speed was 2 mm/min, the heating temperatures in the three-temperature zones were 140° C., 220° C. and 120° C., respectively, the winding speed was 1800 mm/min, and the diameter of piezoelectric fiber was about 1 mm.

The obtained piezoelectric fiber was tested as follows:
(1) the prepared piezoelectric fiber was polarized at a voltage of 5 kV in a silicone oil bath at 80° C. for 24 h;
(2) the piezoelectric fiber was fixed on a polyimide (PI) substrate with a length of 10 cm, a width of 5 cm, and a thickness of 1 mm to prepare a piezoelectric generator. One end of the PI substrate was fixed and the other end was moved horizontally by a micro-positioning table, thereby bending the piezoelectric generator to generate voltage and current;
(3) when the moving end of the generator was offset to 10 mm, the piezoelectric generator was bent, the corresponding open-circuit voltage was increased to 9 V, and the short-circuit current was 53 nA;
(4) the piezoelectric generator was continuously subjected to a 3-day bending release test to evaluate its mechanical stability, and the amplitudes of the measured output voltage and current showed high stability over 25920 bending release cycles.

It can be seen from the above-mentioned embodiments that the piezoelectric fiber with a Swiss-roll structure of the present disclosure greatly increases the effective surface area and reduces the layer thickness, so that the voltage and current are greatly increased, and with the increase of the turns of winding, the piezoelectric effect is obviously increased. When the piezoelectric layer adopts perovskite ceramic (BTO or PZT) nanoparticles-impregnated or CNT-impregnated PVDF polymer, the piezoelectric effect is also increased; at the same time, the unique structure of the present disclosure enables it to collect mechanical energy from different directions, and compared with that the mechanical energy can only be collected from one or a limited number of directions in existing piezoelectric fibers, the present disclosure can obtain better piezoelectric effect, so that more complex functions can be realized, and a real multifunctional fiber can be realized, such as can be used for wearable equipment, etc.

Although the present invention has been disclosed in the form of embodiments and variations thereon, it will be understood that numerous additional modifications and variations could be made thereto without departing from the scope of the invention.

For the sake of clarity, it is to be understood that the use of 'a' or 'an' throughout this application does not exclude a plurality, and 'comprising' does not exclude other steps or elements.

What is claimed is:

1. A preparation method for a piezoelectric fiber, comprising a piezoelectric functional layer and an insulating layer coated on the piezoelectric functional layer; wherein, the piezoelectric functional layer comprises a piezoelectric composite layer of a spiral winding structure, the piezoelectric composite layer is wound into more than five turns attached to one another from a center of the spiral winding structure to an outer side, and the piezoelectric composite layer comprises a first piezoelectric layer, a conductive layer and a second piezoelectric layer that are sequentially stacked, further wherein a material of the conductive layer is selected from the group consisting of carbon-supported polyethylene, carbon-impregnated low-density polyethylene, and graphene; the preparation method comprising:
(1) stacking the first piezoelectric layer, the conductive layer and the second piezoelectric layer in sequence, and then respectively softening the first piezoelectric layer and the second piezoelectric layer in a heated state and attaching them to the conductive layer to prepare the piezoelectric composite layer;
(2) taking one end of the piezoelectric composite layer as a winding axis, winding the piezoelectric composite layer in a direction perpendicular to the winding axis to form the piezoelectric functional layer, wherein turns of winding the piezoelectric composite layer are greater than five, coating the piezoelectric functional layer with the insulating layer, and vacuum heating to consolidate, to prepare a preform rod; and
(3) thermal stretching on the preform rod to prepare the piezoelectric fiber.

2. The preparation method for a piezoelectric fiber according to claim 1, wherein in step (1), wherein a heating temperature of the heated state is 85-105° C.

3. The preparation method for a piezoelectric fiber according to claim 1, wherein in step (2), wherein a temperature of the vacuum heating is 110-120° C., and a diameter of the preform rod is 10-100 mm.

4. The preparation method for a piezoelectric fiber according to claim 1, wherein in step (3), the thermal stretching is carried out in a heating and stretching furnace with three temperature zones, and heating temperatures in the three temperature zones are 135-145° C., 210-230° C., and 110-130° C.

5. The preparation method for a piezoelectric fiber according to claim 1, wherein the turns of winding the piezoelectric composite layer have a number of 30-90.

6. The preparation method for a piezoelectric fiber according to claim 1, wherein thickness of the first piezoelectric layer, thickness of the conductive layer, and thickness of the second piezoelectric layer are independently 100-300 µm.

7. The preparation method for a piezoelectric fiber according to claim 1, wherein thickness of the first piezoelectric layer, thickness of the conductive layer, and thickness of the second piezoelectric layer are the same.

8. The preparation method for a piezoelectric fiber according to claim 1, wherein the first piezoelectric layer and the second piezoelectric layer are independently selected from the group consisting of polyvinylidene fluoride, poly(vinylidene fluoride-trifluoroethylene), perovskite ceramic nanoparticle-impregnated polyvinylidene fluoride and carbon nanotube-impregnated polyvinylidene fluoride.

9. The preparation method for a piezoelectric fiber according to claim 1, wherein material of the insulating layer is selected from the group consisting of polycarbonate, polydimethylsiloxane, polyethylene terephthalate.

10. The preparation method for a piezoelectric fiber according to claim 1, wherein thickness of the insulating layer is 500-700 µm.

* * * * *